United States Patent Office 3,453,435

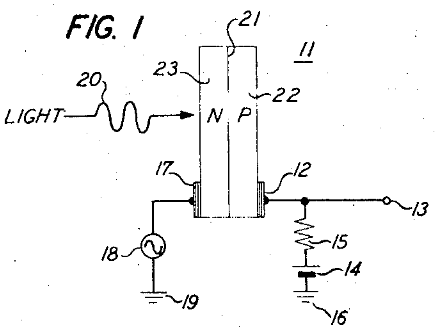
FIG. 2
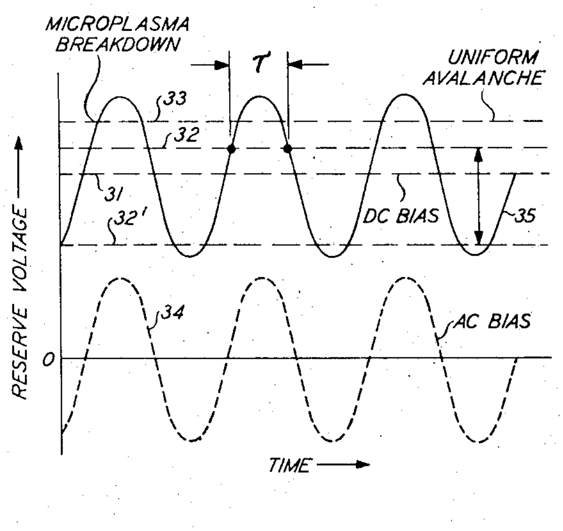
FIG. 3
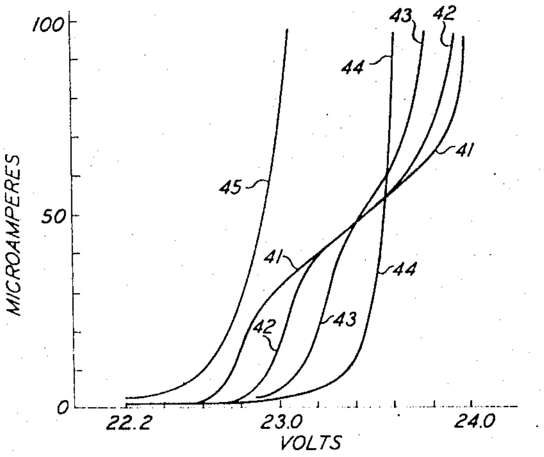
INVENTOR
A. GOETZBERGER
BY H W Lockhart
ATTORNEY

Patented July 1, 1969

3,453,435

AVALANCHE PHOTODETECTOR UTILIZING AN A-C COMPONENT OF BIAS FOR SUPPRESSING MICROPLASMAS

Adolf Goetzberger, Berkeley Heights, N.J., assignor to Bell Telephone Laboratories, Incorporated, Berkeley Heights, N.J., a corporation of New York

Filed May 18, 1967, Ser. No. 639,386
Int. Cl. H01j *39/12;* H01l *15/06*
U.S. Cl. 250—211 6 Claims

ABSTRACT OF THE DISCLOSURE

The photoresponse of a semiconductor PN junction diode biased for avalanche operation is improved by superimposing an alternating current bias voltage thereon of a magnitude and frequency so as to render small the probability of microplasma breakdown. The superimposed alternating current voltage swings the total applied bias voltage above the microplasma breakdown voltage and also above the uniform avalanche voltage. The time during which the voltage is above the microplasma voltage is made small compared to the average turn-on time of a microplasma. The effect is to suppress microplasma current.

BACKGROUND OF THE INVENTION

*Field of the invention*

The avalanche mode of operation for various types of solid state devices is well-understood and its advantages known. Among the types of devices to which this mode has been applied recently is the semiconductor PN junction photodiode. This combination has further enhanced the value of this device in its application to optical communications systems using a laser beam or carrier.

*Description of the prior art*

Thus, it is known that enhancement of the output power and an increase in the signal-to-noise ratio for a variety of applications can be achieved by biasing a diode in reverse into the region of avalanche operation. In this mode of operation in the particular area of radiation detection, the diode is analogous to a photomultiplier or a quantum counter. Where the diode is used for light detection, each photon of incident light may produce a current flow of thousands of electrons through the device. A certain fraction of the incident photons of light are absorbed in or near the depletion region, generating pairs of carriers by exciting electrons into the conduction band. The carriers then are swept from the depletion region by the field, giving rise to current through the diode terminals. Inasmuch as the diode current then is proportional to the flux of incident photons, which equals the incident power, the diode is a square law detector.

However, the phenomenon known as microplasmas occurring in PN junction devices deleteriously affects the performance of avalanche devices and, in particular avalanche photodiodes. A microplasma is a localized breakdown of the PN junction in a region. In a typical instance a microplasma may be several microns in diameter. In general, a microplasma results when the breakdown voltage of one of the PN junction is significantly lower than the breakdown voltage of the rest of the junction area. The exact cause of this lower breakdown voltage is not known, but may be the result of a fluctuation of doping density, a crystal imperfection or the presence of impurities. The formation of a microplasma may be accompanied by the emission of light from the breakdown region, affecting the current-voltage response characteristic. More serious from the standpoint of detector efficiency, a microplasma produces large amounts of microwave noise, markedly degrading the signal-to-noise ratio.

Diodes in which microplasma are abseint or minimized can be fabricated; however, this requires extraordinary care in design and manufacture and microplasma free diodes are of limited size and restricted, by current technology, to the elemental semiconductors germanium and silicon.

*Summary of the invention*

In accordance with the invention an improved response of an avalanche semiconductor device is achieved by superposing onto a direct current bias voltage an alternating current bias voltage of a frequency that is high compared to the turn-on probability of the microplasma and of an amplitude such that the diode is biased every positive cycle into the region of avalanche operation and every negative cycle into a range where avalanche and microplasma is turned off. Inasmuch as microplasmas do not break down instantaneously after the application of a voltage the superposed alternating current bias voltage thus can suppress the effect of microplasmas.

Accordingly, the mode of operation in accordance with this invention as applied to light detectors enables the fabrication of larger area avalanche photodiodes as well as facilitating the fabrication of those of smaller area. Moreover, for those semiconductor materials for which current fabrication technology does not enable the minimization or avoidance of microplasmas, the mode of operation in accordance with this invention provides the means of achieving avalanche photodetection.

BRIEF DESCRIPTION OF THE DRAWING

FIG. 1. is a schematic circuit diagram illustrating a basic embodiment of the invention;

FIG. 2 is a graph illustrating the time-voltage relation of the applied bias for one mode of the invention;

FIG. 3 is a graph of the current-voltage response characteristic of an avalanche photodiode under various bias frequencies.

DETAILED DESCRIPTION

Figure 4:
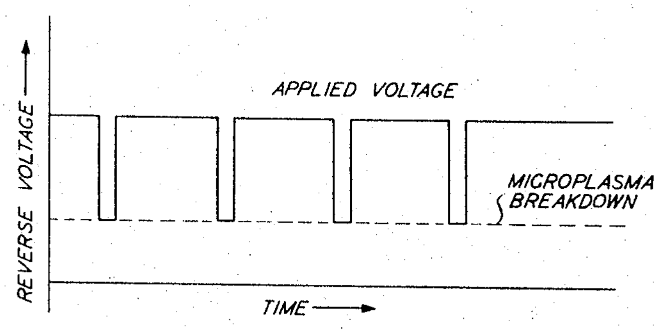
FIG. 4 is a graph illustrating another bias mode in accordance with the invention.

As shown in FIG. 1 of the drawing, a basic form of the invention comprises a PN junction silicon diode 11 including suitable biasing means and light input means and output means. More specifically, the light responsive semiconductor element 11 comprises a monocrystalline wafer of silicon including a zone 22 of P type conductivity and a zone 23 of N type conductivity defining therebetween a PN junction 21. Typically the element is fabricated starting with P type conductivity material of relatively low resistivity and forming a thin N type zone 23 by diffusing an N type impurity such as antimony into the wafer. Typically the wafer is about 15 mils square and 4 mils thick and the N type zone 23 is diffused to a depth of about 0.5 micron. It is advantageous also to provide an intrinsic or very high resistivity zone of about 2.5 to 3 microns between the N zone 23 and the low resistivity P zone 22. This conveniently may be formed by well-known epitaxial deposition techniques.

Ohmic electrodes 12 and 17 are shown in schematic form attached to the P and N type zones 22 and 23 respectively. In particclar, electrode 17 to the N type zone 23 may have a digitated configuration to reduce series resistance while at the same time enabling a maximum surface exposure to the incident light represented by the arrowed wave line 20.

Means for biasing the photodiode consist of the direct current voltage source 14 in series with a resistance 15 and a source of alternating current voltage 18. The photodetected signal then is observed as an electrical output at the terminal 13.

The advantageous mode of operation of the apparatus of FIG. 1 may be better understood by the following explanation taken with reference to the graph of FIG. 2. The diode 11 is biased in reverse at the level denoted by the direct current bias line 31. This is below the value which would be applied for achieving uniform avalanche operation in a microplasma free diode in accordance with the prior art as disclosed for example in the paper "Avalanche Multiplication Photodiodes" by L. A. D'Asaro and L. K. Anderson, Bell Laboratories Record, volume 44, p. 277, September 1966. The microplasma free diode has only one breakdown voltage, corresponding to level 33.

This direct current bias level may be above or below the level of microplasma breakdown voltage. In a particular embodiment, the microplasma breakdown voltage may fall within the range indicated by the upper line 32 and the lower line 32'.

In order to achieve advantageous avalanche operation a bias voltage having an average value as indicated by the broken line 33 must be applied. This is accomplished in one specific embodiment by applying an alternating current voltage as depicted by the broken curve 34. The resultant reverse bias applied to the diode is represented by the curve 35 which is a sum of the direct current bias 31 and the alternating current bias 34. The significant features of the resultant alternating current bias voltage relate to its amplitude and frequency. As is evident from the graph the resultant bias voltage swings far enough in the reverse direction to ensure avalanching and in the other direction to a level at which the probability of microplasma turn-off is high. Further, the interval $\tau$, during which the voltage exceeds the microplasma breakdown level 32 is small compared to the average turn-on time of a microplasma. Thus, the probability that the microplasma turns on is small, and, if it does turn on, it will be extinguished when the voltage swings down into the range of high microplasma turn-off probability. Accordingly, using this biasing technique, substantially uniform avalanche multiplication is observed with almost complete suppression of microplasma effects.

It has been determined that for a typical microplasma the frequency of the cyclic bias voltage must be at least 200 kHz. If many microplasmas are present the frequency must be made higher to increase the probability that no microplasmas will turn on. Further improvement may be realized from using flat-topped pulses in order to obtain more nearly constant avalanche multiplication. However, the desire to have longest possible on-time of avalanche operation by using a large pulse duty cycle must be balanced against the need to keep the pulse length small compared to the average microplasma turn-on time. Moreover, although this specific embodiment is in terms of the super position of a sinusoidal voltage upon a direct current voltage it will be apparent that various other wave forms may be used to produce the desired resultant cyclic characteristic.

FIG. 4 depicts an advantageous pulse form of bias in which the applied voltage is at a desirably high level for sustaining avalanche operation but at suitably frequent intervals drops to a level near the microplasma voltage or in the range of high probability of microplasma turn-off to extinguish any which have turned on. Thus, in a sense, the microplasma turn-on probability is essentially time dependent while the turn-off probability is primarily voltage dependent. The net effect is a substantial suppression of microplasma effects.

The advantages of the mode of operation in accordance with the invention are depicted in one form in the graph of FIG. 3. A silicon guard ring photodiode of the type described in the above-noted paper and selected to have a single microplasma was subjected to an alternating current bias voltage at a frequency of 1 gHz. The curves in the graph of FIG. 3 depict the characteristics of this diode.

In curve 41 no alternating current bias is used and the diode is not illuminated. The effect of the microplasma is shown as a constant resistance evidenced by the straight line portion between 30 and 70 microamperes. At low currents, less than about 30 microamperes the microplasma is not on all the time and therefore the average current is lower than it would be if it were determined by the constant resistance. At high currents the onset of the uniform avalanche is evidenced by the departure from the straight line portion above about 70 microamperes.

Curve 42 depicts the response with an alternating current voltage fo 270 millivolts, peak-to-peak applied at 1 gHz. Reduction in the one-time of the microplasma is evidenced by the reduction in the straight line portion of the curve.

Curve 43 shows the characteristic for a peak-to-peak voltage of 480 millivolts evidencing a further suppression of microplasma current and curve 44 indicates a virtual elimination of microplasma effect with a voltage of about 780 millivolts. With still higher alternating current voltage, about 1.5 volts, the rectification current due to the non-linearity of the current voltage characteristic offsets the effect of the on-time reduction of the microplasmas. This effect is evidenced by curve 45 which is shifted in entirety by the rectification current.

The foregoing example indicates that the application of an alternating current bias reduces the average microplasma current in a certain current-voltage range which depends on the microplasma. Accordingly, a reduction of the microplasma noise and an increased multiplication is possible in an avalanche photodiode with microplasmas when the proper alternating current bias voltage and frequency and the proper direct current operation point are selected. Increased photomultiplication arises from the larger area of uniform multiplication compared to microplasma multiplication.

In a further demonstration of the improvement in photomultiplication in accordance with the biasing technique disclosed herein, a laser light of wavelength 6328 Angstroms having a power of one microwatt was chopped at 1 kHz. and focused on the diode described in the preceding example. The direct current bias voltage alone was applied and adjusted for maximum avalanche multiplication of the photocurrent. A maximum photocurrent increase of about 200 was observed. Application of alternating current voltages at 900 mHz. at various values produced a maximum improvement factor of about 70 at a value of about 1.6 volts alternating current peak-to-peak. The improvement factor is the ratio of maximum photomultiplication with alternating current bias to maximum photomultiplication without alternating current bias.

Additional observations of uniform avalanche multiplication with the suppression of microplasma effects have been made from the appearance of the electroluminescence in diodes such as described above. Such electroluminescence was observed to become uniform when alternating current bias was applied.

Moreover, although the invention has been specifically described in terms of radiation detecting devices, it will be understood that the principles of microplasma suppression are generally applicable to other semiconductor devices operating in the avalanche mode for other signal translating functions.

Although the invention has been disclosed in terms of a specific embodiment it will be understood that other arrangements may be devised by those skilled in the art which likewise will fall within the scope and spirit of the invention.

What is claimed is:

1. Signal translating apparatus including a semiconductor device conditioned for operation in the avalanche mode characterized in that there is applied to said device a bias voltage having a cyclic characteristic of an amplitude extending from less than avalanche breakdown to the level of avalanche operation and a frequency such as to substantially inhibit continuous microplasma breakdown.

2. Apparatus in accordance with claim 1 in which the cyclic bias voltage has an amplitude at one extreme which is in the range of high turn-off probability for microplasma.

3. Apparatus for detecting radiant energy comprising a semiconductor PN junction diode biased in the reverse direction for operation in the avalanche mode characterized in that the bias voltage has a cyclic characteristic of an amplitude extending from less than avalanche breakdown to the region of avalanche operation and a frequency such as to substantially inhibit continuous microplasma breakdown.

4. Apparatus in accordance with claim 3 in which the cyclic characteristic is a sine wave.

5. Apparatus in accordance with claim 3 in which the cyclic characteristic is a substantially flat-topped pulse form.

6. Apparatus in accordance with claim 3 in which the frequency is in excess of about 200 kHz.

References Cited

D'Asaro et al.: "At the End of the Laser Beam, a More Sensitive Photodiode," *Electronics,* May 30, 1966, pp. 94 to 98, vol. 39, No. 11.

ARCHIE R. BORCHELT, *Primary Examiner.*

T. N. GRIGSBY, *Assistant Examiner.*

U.S. Cl. X.R.

250—214; 317—235